(12) United States Patent
Stewart et al.

(10) Patent No.: US 11,495,658 B2
(45) Date of Patent: Nov. 8, 2022

(54) HYBRID HIGH AND LOW STRESS OXIDE EMBEDDED CAPACITOR DIELECTRIC

(71) Applicant: TEXAS INSTRUMENTS INCORPORATED, Dallas, TX (US)

(72) Inventors: Elizabeth Costner Stewart, Dallas, TX (US); Jeffrey A. West, Dallas, TX (US); Thomas D. Bonifield, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/435,095

(22) Filed: Jun. 7, 2019

(65) Prior Publication Data

US 2019/0378892 A1 Dec. 12, 2019

Related U.S. Application Data

(60) Provisional application No. 62/682,682, filed on Jun. 8, 2018.

(51) Int. Cl.
| | | |
|---|---|---|
| *H01L 49/02* | (2006.01) | |
| *H01L 27/07* | (2006.01) | |
| *H01L 29/06* | (2006.01) | |
| *H01L 23/522* | (2006.01) | |

(52) U.S. Cl.
CPC .......... *H01L 28/60* (2013.01); *H01L 23/5223* (2013.01); *H01L 23/5226* (2013.01); *H01L 27/0733* (2013.01); *H01L 29/0649* (2013.01)

(58) Field of Classification Search
None
See application file for complete search history.

(56) References Cited

U.S. PATENT DOCUMENTS

| | | | |
|---|---|---|---|
| 10,109,574 B1 | 10/2018 | West et al. | |
| 10,147,784 B2 | 12/2018 | West et al. | |
| 2006/0276027 A1* | 12/2006 | Lu | H01L 21/76829 438/622 |
| 2007/0278541 A1* | 12/2007 | Huang | H01L 29/1083 257/288 |
| 2014/0353790 A1* | 12/2014 | Park | H01L 31/02161 257/432 |
| 2014/0367805 A1* | 12/2014 | Chen | B81C 1/00801 257/415 |
| 2016/0133690 A1* | 5/2016 | West | H01L 28/40 257/534 |

OTHER PUBLICATIONS

"Tensors: Stress, Strain and Elasticity", by Pamela Burnley, University of Nevada Las Vegas. 12 pages, https://serc.carleton.edu/NAGTWorkshops/mineralogy/mineral_physics/tensors.html, accessed Apr. 28, 2021.

* cited by examiner

*Primary Examiner* — Alexander G Ghyka
(74) *Attorney, Agent, or Firm* — Andrew R. Ralston; Charles A. Brill; Frank D. Cimino

(57) ABSTRACT

An electronic device, e.g. integrated circuit, has top and bottom metal plates located over a substrate, the bottom plate located between the top plate and the substrate. A high-stress silicon dioxide layer is located between the bottom plate and the substrate. At least one low-stress silicon dioxide layer is located between the top plate and the bottom plate.

25 Claims, 12 Drawing Sheets

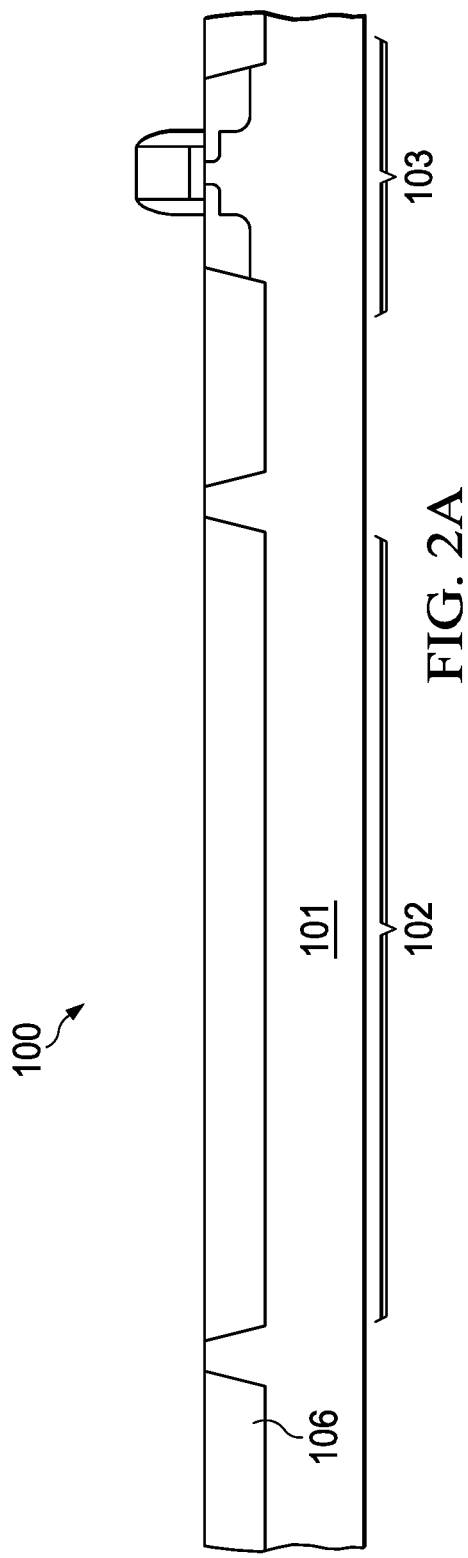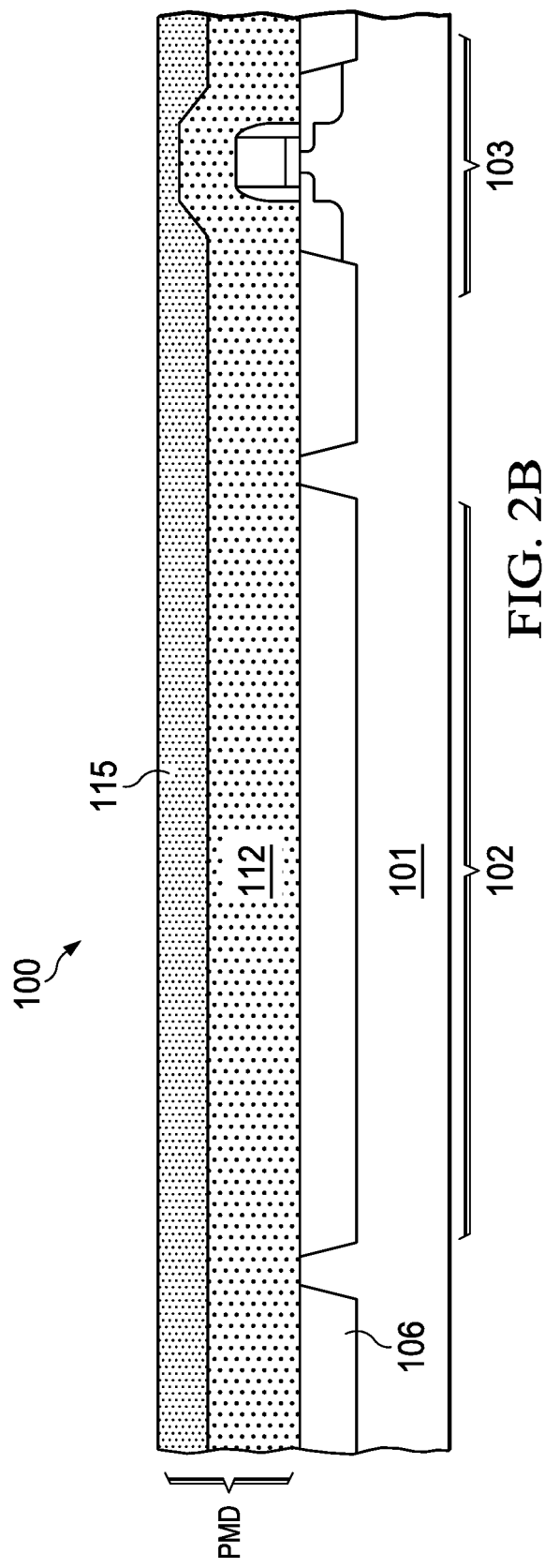

HYBRID HIGH AND LOW STRESS OXIDE EMBEDDED CAPACITOR DIELECTRIC

CROSS REFERENCE TO RELATED APPLICATIONS

This application claims the benefit of U.S. Provisional Application No. 62/682,682 filed on Jun. 8, 2018, the entirety of which is hereby incorporated herein by reference. This application is related to U.S. Pat. Nos. 9,299,697, 10,109,574 and 10,147,784, and U.S. Provisional Application Ser. No. 62/826,047, the entireties of which are incorporated by reference herein.

FIELD

This disclosure relates to the field of semiconductor devices, and more particularly, but not exclusively, to capacitors suitable for isolation of signals in a semiconductor device.

BACKGROUND

Some integrated circuits include a capacitor formed in the interconnect levels. Such capacitors may include a lower plate formed in a lower metal level, an upper metal plate formed in a higher metal level, and several dielectric layers between the upper and lower plates. Such a capacitor may be used to isolate a higher voltage circuit from a lower voltage circuit, with the capacitor coupling a signal between the two circuits.

SUMMARY

The inventors disclose various methods and devices that may be beneficially applied to manufacturing capacitors, and integrated circuits (ICs) including such capacitors, with reduced wafer bow or warp as compared to baseline devices, while substantially excluding moisture from dielectric in contact with electrodes of the capacitor. While such embodiments may be expected to provide high reliability and improved manufacturing yield, no particular result is a requirement of the described invention(s) unless explicitly recited in a particular claim.

The present disclosure provides an electronic device, e.g. an integrated circuit. Top and bottom metal plates are located over a substrate, the bottom plate located between the top plate and the substrate. A high-stress silicon dioxide layer is located between the bottom plate and the substrate. At least one low-stress silicon dioxide layer is located between the top plate and the bottom plate.

Another example provides a method, e.g. of forming an electronic device as described above.

The disclosure also provides an integrated circuit that includes top and bottom metal plates formed over a substrate. A first HDP oxide layer is located over and touches the bottom metal plate. A first low-stress silicon dioxide layer is located over and touches the HDP oxide layer. A first high-stress silicon dioxide layer is located over and touches the low-stress silicon dioxide layer. A second HDP oxide layer is formed over and touches the first high-stress silicon dioxide layer. A second low-stress silicon dioxide layer is located over and touches the second HDP oxide layer. A second low-stress silicon dioxide layer is located over and touches the second HDP oxide layer.

Another example provides an integrated circuit that includes top and bottom metal plates formed over a substrate, with the bottom plate located between the top plate and the substrate. A first HDP oxide layer is formed between the bottom plate and the top plate, and touches the bottom metal plate. A first high-stress silicon dioxide layer is located over and touches the HDP oxide layer. A second HDP oxide layer is located over the first high-stress silicon dioxide layer. A second high-stress silicon dioxide layer is located over and touches the second HDP oxide layer. A low-stress silicon dioxide layer is located over and touching the second high-stress silicon dioxide layer.

BRIEF DESCRIPTION OF THE VIEWS OF THE DRAWINGS

FIGS. 2A-2K illustrate sectional views of the device of FIG. 1A at progressive stages of manufacturing.

DETAILED DESCRIPTION

Figure 1A:
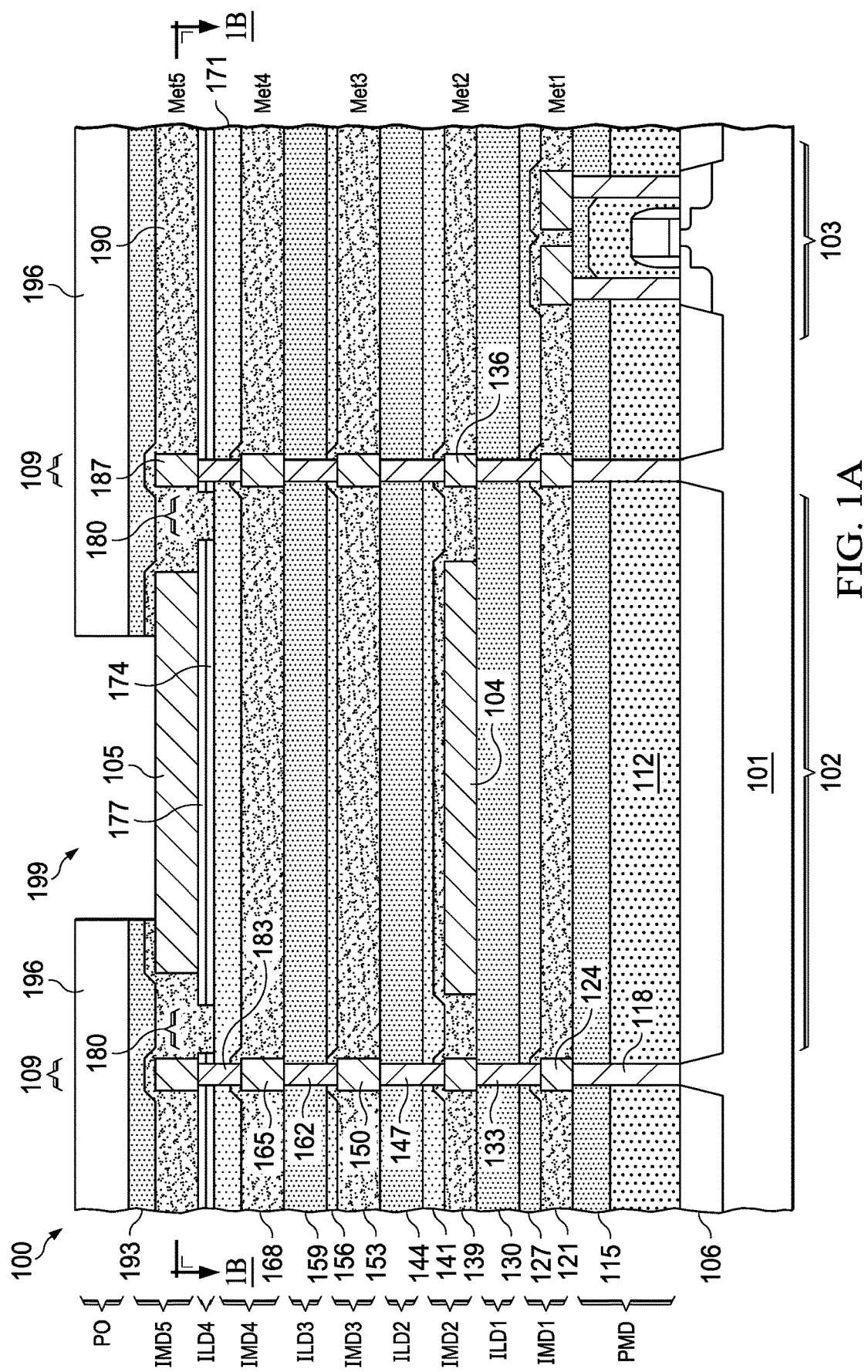
FIGS. 1A and 1B respectively illustrate section and plan views of an electronic device according to principles of the disclosure, including a capacitor implemented in a five-level-metal (5LM) process.

The present disclosure is described with reference to the attached figures. The figures may not be drawn to scale and they are provided merely to illustrate the disclosure. Several aspects of the disclosure are described below with reference to example applications for illustration, in which like features correspond to like reference numbers. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

In some circumstances it may be desirable to ensure the moisture content does not exceed a small value in a dielectric that is in contact with a capacitor electrode. For example, some integrated circuit capacitors may be used to isolate a high-voltage signal node from a low voltage signal node, providing capacitive coupling of a signal between the nodes. Such isolation is sometimes referred to as "galvanic isolation", and such a capacitor may be referred to as a "galvanic Capacitor." Moisture in proximity to one or both electrodes of a galvanic capacitor may lead to decreased lifetime or reliability due to, e.g. corrosion of the electrode or dielectric breakdown.

Appropriate selection of the dielectric in which the galvanic capacitor electrodes are embedded may reduce the amount of moisture uptake by that dielectric over the operational lifetime of the galvanic capacitor. In some cases, however, dielectrics that are suitable for minimizing moisture uptake tend to have a higher compressive stress than dielectrics with a higher moisture uptake. In some capacitor configurations the accumulated stress of multiple layers of such a low moisture-uptake dielectric may result in wafer warpage, or "bow" that the wafer cannot be reliably seated on some processing tool stages in the manufacturing process flow. When the wafer is not properly seated, a tool fault may occur, reducing manufacturing throughput, or in some case may result in wafer scrap or even breakage, necessitating a burdensome tool cleaning and seasoning.

Accordingly, it is desirable to provide a scheme in which moisture uptake is reduced in the immediate vicinity of the electrodes of a galvanic capacitor, while limiting wafer bow and warp to a level that does not adversely impact the manufacturing flow.

The inventors have determined that in various examples this objective may be effectively addressed by providing a first class of dielectric material(s) in contact with first and second electrodes of the galvanic capacitor, wherein the dielectric material(s) of the first class has a relatively low moisture update and a relatively higher first compressive stress value. One or more dielectric layers between the first and second electrodes are formed from a second class of dielectric material(s) that have a relatively lower second compressive stress level and may have a second higher moisture uptake. By providing a lower moisture-uptake dielectric in the immediate vicinity of the capacitor electrodes, the potential negative effects of moisture near these electrodes is reduced, while providing one or more dielectric layers with a lower stress between the electrodes reduces the potential for adverse manufacturing events associated with substrate bowing.

Figure 1B:
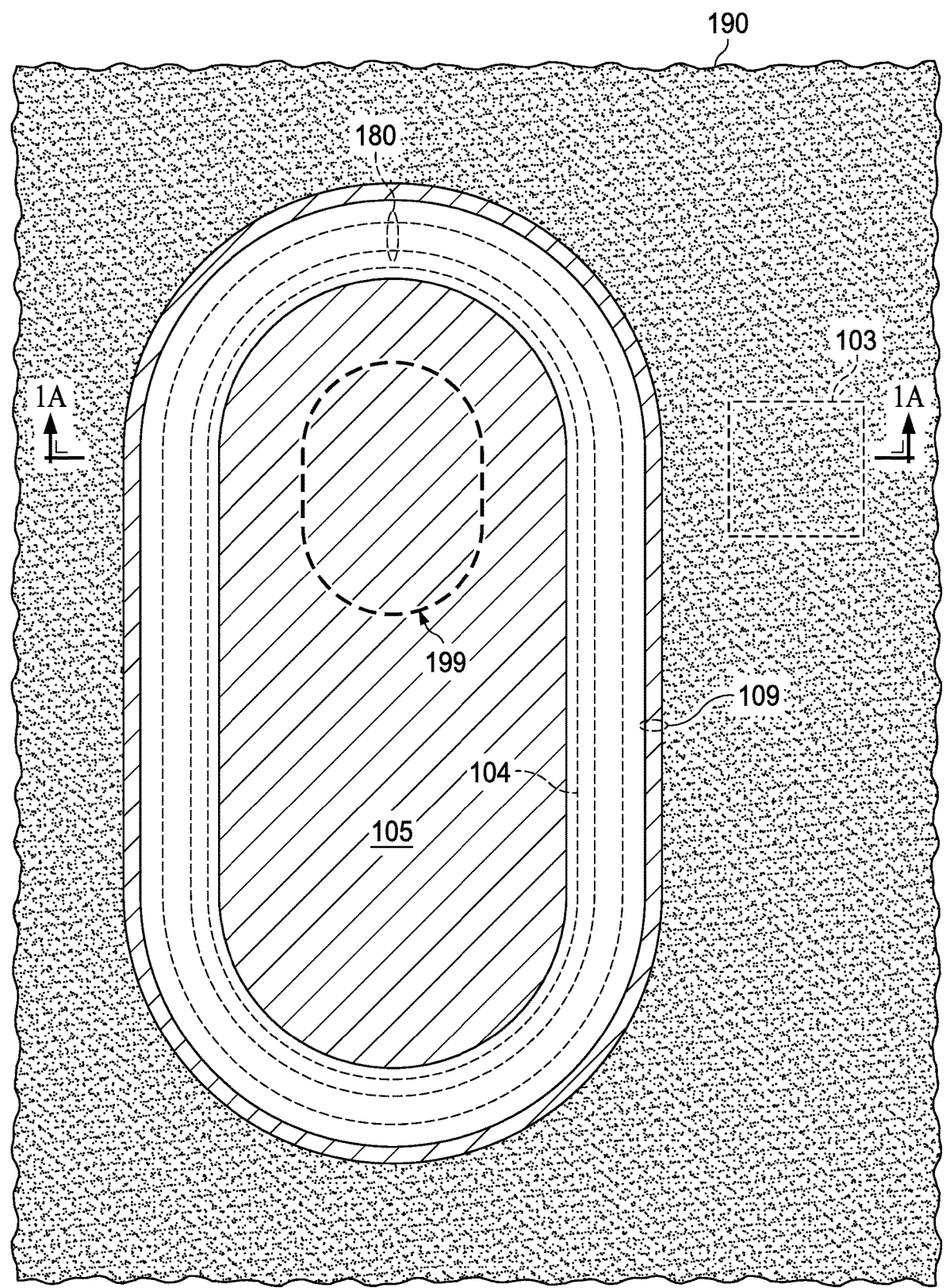

Turning to FIG. 1A, an electronic device 100 is shown in section view. Corresponding FIG. 1B shows the device 100 in a plan view taken at the plane shown in FIG. 1A. The electronic device 100 includes a semiconductor substrate 101 over which a capacitor 102 and an optional transistor 103 are formed. The capacitor 102 includes a first electrode 104 and a second electrode 105. Without implied limitation the first electrode 104 may be referred to as bottom plate 104, and the second electrode 105 may be referred to as top plate 105. In various examples the top plate 105 and the bottom plate 104 are about the same size and shape, the bottom plate 104 is directly between the top plate 105 and the substrate 101 along a surface normal. The top plate 105 may be connected to a high-voltage circuit node, while the bottom plate 104 and the transistor 103 may be connected to a low-voltage circuit node.

In various examples each of the bottom plate 104 and the top plate 105 has a minimum length along a longest axis of about 30 µm and has a minimum length along an orthogonal shortest axis of about 30 µm. In various examples each of the bottom plate 104 and the top plate 105 has an aspect ratio (length of longest axis divided by length of orthogonal shortest axis) of in a range between about one and about five. The plates 104 and 105 are not limited to any particular shape, for example may be square round, rectangular, ovoid or "race track". In some further examples, the plates 104 and 105 have a minimum lateral width (parallel to the substrate 101 surface) sufficient to form a wire bond to the top plate 105. Such minimum width may depend on the wire bonding technology, and without implied limitation may be about 80 µm. In one specific and non-limiting example, the plates 104 and 105 each have a short axis length of about 120 µm and a short axis length of about 160 µm. In another specific and non-limiting example, the plates 104 and 105 are both about circular, with a diameter of about 100 µm. In some examples, one of the bottom plate 104 and the top plate 105 is implemented as a plurality of plates, e.g. two plates. Thus, in one non-limiting example, the bottom plate 104 may be a single continuous metal plate, while the top plate 105 may be two noncontiguous metal plates. In such examples, the two or more plates need not be a same shape, or have a same area.

The example of FIG. 1A illustrates a five-level-metal (5LM) device 100 without implied limitation thereto. The device 100 therefore includes five metal levels designated MET1 . . . MET5. Each metal level includes metal features within a corresponding inter-metal dielectric (IMD) layer IMD1 . . . IMD5. An interlevel dielectric (ILD) layer is located between each IMD layer, such that there are dielectric layers ILD1 . . . ILD4. A poly-metal dielectric (PMD) layer is located between the IMD1 level and the substrate 101, and a passivation overcoat (PO) layer overlies the top metal layer IMD5. An optional isolation structure 106, e.g. a shallow trench isolation structure, is located between the PMD layer and the substrate 101. The isolation structure 106 may reduce capacitive coupling between the bottom plate 104 and the substrate 101. In other examples, not shown, the isolation structure 106, if present, may include one or more doped well regions that may provide junction isolation between the bottom plate 104 and the substrate 101. The bottom plate 104 is located in the MET2 level in the illustrated example, but could be located in another metal level in other examples. The level in which the bottom plate 104 is located may be selected in part based on the desired isolation of the bottom plate 104 from the substrate 101, and the desired capacitive coupling to the top plate 105.

The plates 104 and 105 may be formed from any suitable metal. Examples described herein may describe the plates 104 and 105 as being formed from aluminum, but those skilled in the pertinent art will understand the described principles may be adapted to other metal interconnect systems, such as copper, without undue experimentation. The top plate 105 may be configured to receive a high voltage signal, e.g. via a wire ball-bonded to the top plate 105. The high voltage signal may be received from a high-voltage source to which the device 100 is connected, e.g. an electric motor, to provide an electronic function such as monitoring or controlling. In various examples, "high voltage" may refer to a static or RMS voltage of about 100 V or more, and "low voltage" may refer to a static or RMS voltage of about 20 V or less.

The top plate 105 is capacitively coupled to the bottom plate 104 through the one or more intervening dielectric layers, in the current example ILD2 . . . ILD4 and IMD2 . . . IMD4. The coupling may induce on the bottom plate 104 an attenuated electric signal corresponding to the high-voltage signal present at the top plate 105. The attenuated signal at the bottom plate 104 may then be coupled to another electronic device on another semiconductor substrate, or may be routed to an electronic device located on the same substrate, such as the transistor 103. The plates 104 and 105 are located between via stacks, described further below, that connect to the substrate 101. The substrate 101 may provide a ground reference for the via stacks, such that the via stacks may provide a guard ring 109 that terminates electric field lines from the plates 104 and/or 105.

In the following discussion three types of silicon dioxide dielectric materials are described. Two types may be produced by a plasma-enhanced chemical vapor deposition (PECVD) process in a capacitively-coupled plasma reactor using tetraethoxysilane (TEOS) feedstock. These dielectrics are referred to herein without implied limitation as "PE-TEOS". As described further below, a first type of PE-TEOS is a "high-stress" PE-TEOS, and a second type of PE-TEOS is "low-stress" PE-TEOS. In a non-limiting example, a "high-stress" PE-TEOS process described in detail below produces an $SiO_2$ layer with about 120 MPa compressive stress, whereas a "low-stress" PE-TEOS process described in detail below produces an $SiO_2$ layer with about 20 MPa compressive stress. A third type of silicon dioxide may be produced using by a high-density plasma in an inductively-coupled reactor, and is referred to without implied limitation as "HDP oxide".

The high-stress PE-TEOS and HDP oxide typically takes up less moisture than low-stress PE-TEOS, for example in terms of ppm (w/w), and may be used to encapsulate layers using the low-stress PE-TEOS to reduce the cumulative stress of the dielectric stack. Due to their lower moisture uptake, it is generally preferable to use these dielectrics in the immediate vicinity of the top plate 105 and/or the bottom plate 104, e.g. to reduce the potential for corrosion and dielectric breakdown during high-voltage operation. While low moisture uptake is desirable throughout the dielectric stack of the capacitor 102, the accumulated stress of multiple layers of high-stress PE-TEOS and/or HDP oxide may cause excessive deformation of the substrate on which the capacitor 102 is formed, e.g. a 200 mm or 300 mm silicon wafer. This deformation, sometimes referred to as "wafer bow" or "wafer warp", may cause manufacturing faults if the substrate cannot be properly clamped during processing, or may even lead to wafer breakage.

Thus, in various advantageous examples, HDP oxide and/or high-stress PE-TEOS is used as the dielectric in close proximity to or in contact with the plates 104 and 105, while one or more of the dielectric levels between the plates 104 and 105 include low-stress PE-TEOS to reduce wafer bow. But because of its higher moisture uptake, it may be generally preferred to exclude contact between low-stress PE-TEOS and the metal plates 104 and 105. In this manner, the advantage of lower moisture uptake near the plates 104 and 105 may be realized, while wafer bow may be limited to a manageable level, reducing yield loss due to the aforementioned manufacturing issues.

Returning to the example of FIG. 1A, the PMD level is illustrated including a phosphorous-doped silicate glass (PSG) layer 112 and a high-stress PE-TEOS layer 115. In some other examples the PMD level may be undoped and formed from a single dielectric type. The specific selection of the PMD level dielectric may depend on, e.g. the presence or absence of transistors on the substrate 101. The IMD1 level is illustrated including an HDP oxide sublayer 121 and a high-stress PE-TEOS sublayer 127. Such a configuration may be produced by first depositing the HDP oxide sublayer 121 over MET1 features, with the MET1 features producing topography in the HDP oxide sublayer 121. As used herein, the term "topography" is defined as a deviation of the top surface of a material layer from planarity by at least 10% of the layer thickness within a lateral distance of three times the layer thickness. The high-stress PE-TEOS sublayer 127 is formed over the HDP oxide sublayer 121 and planarized to produce a suitable surface for further processing. (See FIGS. 2D and 2E.) A high-stress PE-TEOS layer 130 is then formed over the planarized surface of the high-stress PE-TEOS sublayer 127.

In the illustrated example, the lower plate 104 is formed on the high-stress PE-TEOS sublayer 130 in the MET2 level, and an HDP oxide layer 139 is formed over the lower plate 104. Thus the lower plate 104 is bounded by HDP oxide on top and side surfaces, and by high-stress PE-TEOS on the bottom surface. The lower plate 104 and the upper plate 105 are spaced apart by the ILD2, IMD3, ILD3, IMD4 and ILD4 levels. As described further below the IMD2, IMD3 and IMD4 levels each include a respective low-stress PE-TEOS layer 141, 156, 171. The presence of these low stress layers, in lieu of a higher stress dielectric such as high-stress PE-TEOS or HDP oxide, reduces the cumulative stress of the dielectric stack, and the associated wafer bow, but presents some risk of moisture absorption in the low-stress layers. However, the upper plate 105 is located partially within the IMD5 layer, which includes an HDP oxide layer 190. The HDP oxide layer 190 covers or touches sidewalls and a portion of the top surface of the upper plate 105, such that only an opening 199 formed for wire bonding is exposed to the ambient. A passivation overcoat (PO) level covers remaining portions of the IMD5 level. Furthermore, the low-stress PE-TEOS layer 171 is covered by an optional SiN layer 177 and an optional SiON layer 174. Thus the low-stress PE-TEOS layers 141, 156, 171 are encapsulated by other dielectric layers that effectively prevent moisture diffusion into the dielectric stack and/or prevent significant out-diffusion of moisture incorporated in the low-stress PE-TEOS layers during manufacturing. In other examples, not shown, the SiN layer 177 and SiON layer 174 may be omitted, for example in relatively low-voltage applications in which the risk of dielectric breakdown near corners of the top plate 105 is reduced. In such examples, the low-stress PE-TEOS layer 171 may be replaced by a high-stress PE-TEOS layer of similar thickness.

In the example of FIG. 1A, each oxide layer is in direct contact with one or more neighboring oxide layers. In other examples, a thin layer of a dissimilar dielectric may be placed between some neighboring oxide layers. For example, a nitrogen-containing dielectric such as SiN or SiON may be placed between a low-stress PE-TEOS layer and a high-stress PE-TEOS layer, or between a low-stress PE-TEOS layer and an HDP oxide layer. The dissimilar dielectric, if used, may be a thin layer, e.g. 30-300 nm, to minimize the contribution to the cumulative stress of the dielectric stack.

Turning to FIGS. 2A-2L, section views of the device 100 are shown in successive stages of manufacturing. In the following description, reference is made to the high-stress PE-TEOS film, the low-stress PE-TEOS film, and the HDP oxide film. Unless stated otherwise these films may be produced using process conditions consistent with Table I.

TABLE I

| | Low-Stress PE-TEOS | High-Stress PE-TEOS | HDP Oxide |
|---|---|---|---|
| Reactor Type | Capacitively coupled plasma | Capacitively coupled plasma | Inductively coupled plasma |
| Power | 600 W | 850 W | 3.5 kW |
| TEOS Flow Rate | 1700 mgm[1] | 1900 mgm | N/A |
| Deposition Rate[2] | N/A | N/A | 780 nm/min |
| Etch Rate | | | 1770 nm/min |
| Pressure | 5 Torr (667 Pa) | 8.2 Torr (1093 Pa) | 15 mTorr (2 Pa) |
| Compressive stress range | 15-40 MPa | 80-160 MPa | 100-170 MPa |
| Compressive stress nominal | 20 MPa | 120 MPa | 110 MPa |

[1]milligrams per minute
[2]HDP oxide formation includes a deposition component and a simultaneous etch component.

In FIG. 2A the substrate 101 is shown with the transistor 103 having been formed, and the location of the capacitor 102 is shown for reference. As described previously, one or more doped well regions may replace all or a portion of the isolation structure 106. Furthermore, some examples do not include the transistor 103. In such examples the capacitor 102 may be referred to as a "standalone" capacitor. The substrate may be any suitable substrate, e.g. semiconducting or insulating. In some examples, the substrate 101 is a silicon wafer or a portion of a silicon wafer (die), and may be doped, e.g. p-type.

In FIG. 2B the PMD level has been formed. In the illustrated example, shown without implied limitation, a dielectric layer 112 is formed over the substrate 101, and projects vertical topography above the transistor 103. The dielectric layer 112 may be a PSG layer, as is sometimes used over transistors. In the illustrated example, a layer of high-stress PE-TEOS 115 has been formed over the PSG layer 112 and planarized to reduce the topography. In other examples, such as when the device 100 is a standalone device, an undoped dielectric may be used for the dielectric layer 112, e.g. high-stress PE-TEOS, and planarization may be omitted. In such examples, a SiN layer with a compressive stress of about 100 MPa may be used for the layer 115.

Figure 2C:
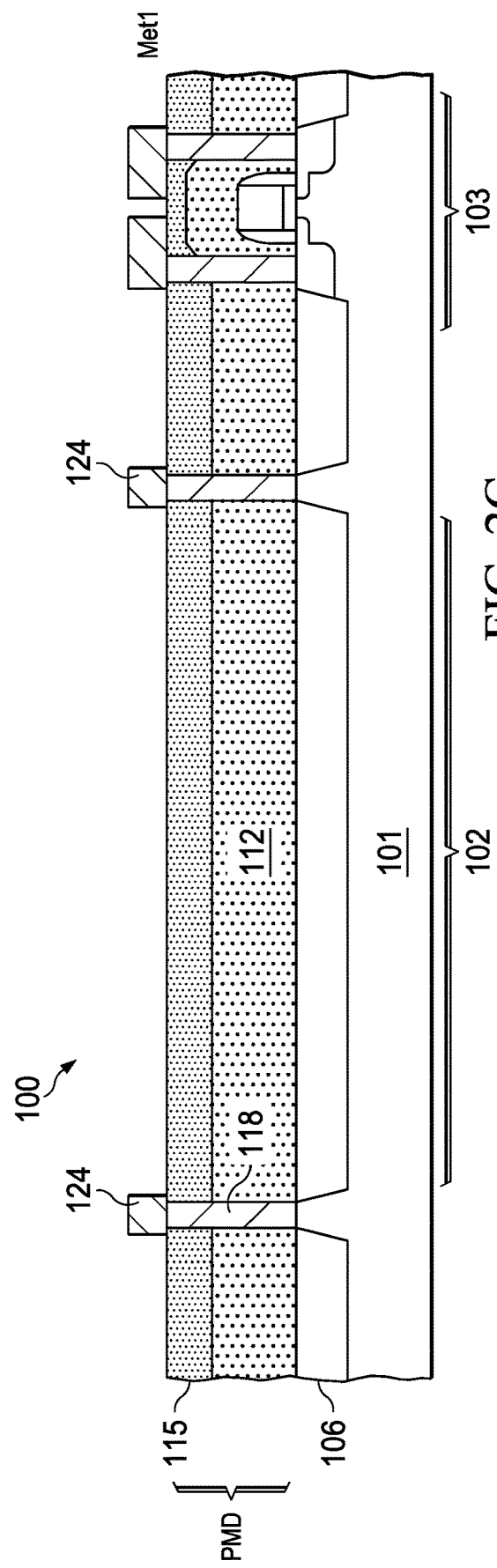

In FIG. 2C contacts 118, e.g. tungsten plugs, have been formed within the dielectric layers 112 and 115, and contact the substrate 101 in the region of the capacitor 102. Additional unreferenced contacts connect to source/drain regions of the transistor 103. A metal layer has been formed over the dielectric layer 115 and patterned to form metal structures 124 connected to the contacts 118, and unreferenced interconnects connected to the source/drain contacts of the transistor 103. Each metal structure 124 may be a landing pad for a subsequent via in the corresponding via stack (see FIG. 1A), or may form a closed ring with a corresponding other of the metal structures 124. The metal layer from which the metal structures 124 are formed may be an Al layer, and the patterning may include conventional lithography and metal etch processes.

Figure 2D:
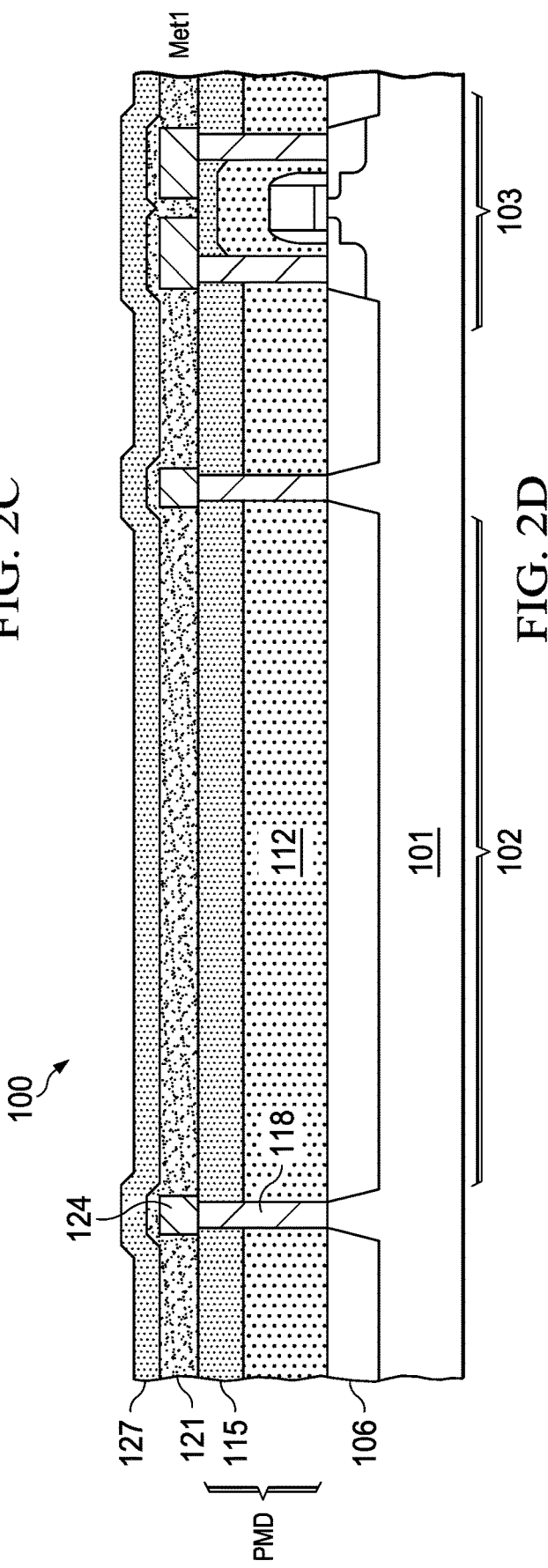
Figure 2E:
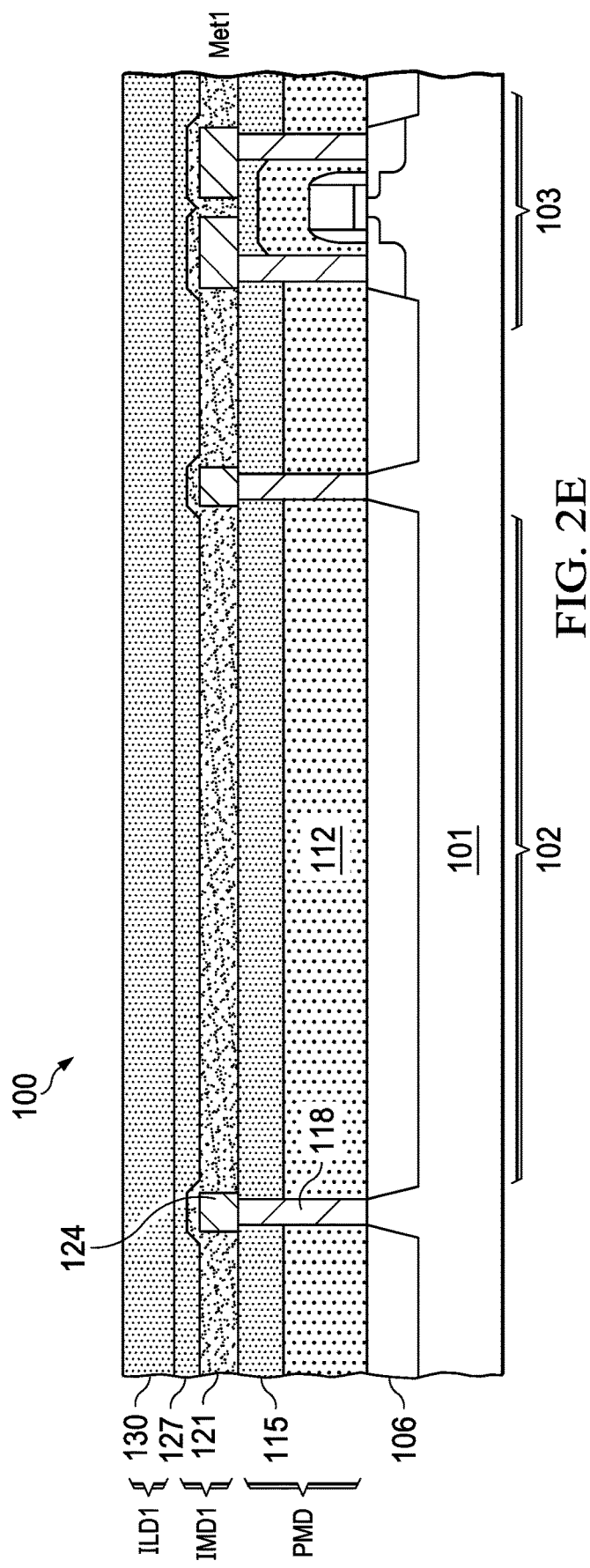

FIG. 2D presents the partially formed device 100 after deposition of an HDP oxide layer 121. HDP oxide may be preferred when spacing between the metal structures 124, or other metal features outside the view of the figure, is small enough that PE-TEOS may not effectively fill the space. In other examples with more relaxed spacing, high-stress PE-TEOS may be used instead. In the illustrated example, a high-stress PE-TEOS layer 127 is formed over the HDP oxide layer 121. Topography associated with the metal structures 124 extends to the surface of the PE-TEOS layer 127. A planarization process, e.g. chemical-mechanical polishing (CMP), is used to remove a portion of the PE-TEOS layer 127, thus reducing the surface topography. FIG. 2E shows the device 100 after planarization of the PE-TEOS layer 127 and deposition of a high-stress PE-TEOS layer 130 on the planarized surface. The HDP oxide layer 121 and high-stress PE-TEOS layer 127 are designated IMD1, and the high-stress PE-TEOS layer 130 is designated ILD1. In another example, not shown, the high-stress PE-TEOS layer 127 may be deposited with a sufficient thickness to act as both the upper portion of the IMD1 level and as the ILD1 level, with the surface of the single PE-TEOS layer then planarized. This alternate implementation may be appropriate when the metal structures 124 have a maximum thickness of, e.g. 500 nm.

Figure 2F:
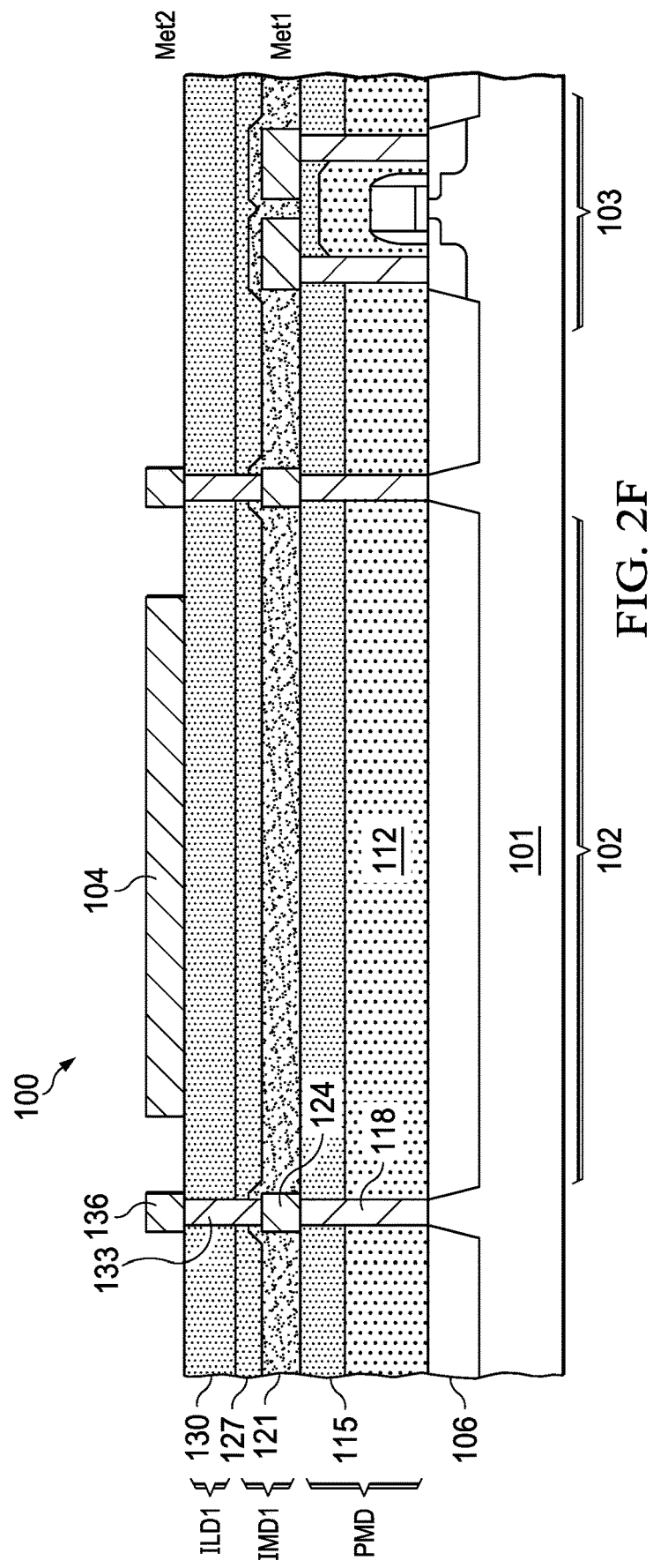

FIG. 2F illustrates the device 100 after forming a MET2 layer over the PE-TEOS layer 130 and patterning the MET2 layer to produce the bottom plate 104 and MET2 structures 136. Vias 133 have been formed within ILD1, e.g. from tungsten, connecting the MET2 structures 136 to the MET1 structures 124. As for the MET1 level, the MET2 layer may be formed from Al. The MET2 structures 136 may follow a similar layout to the MET1 structures 124.

Figure 2G:
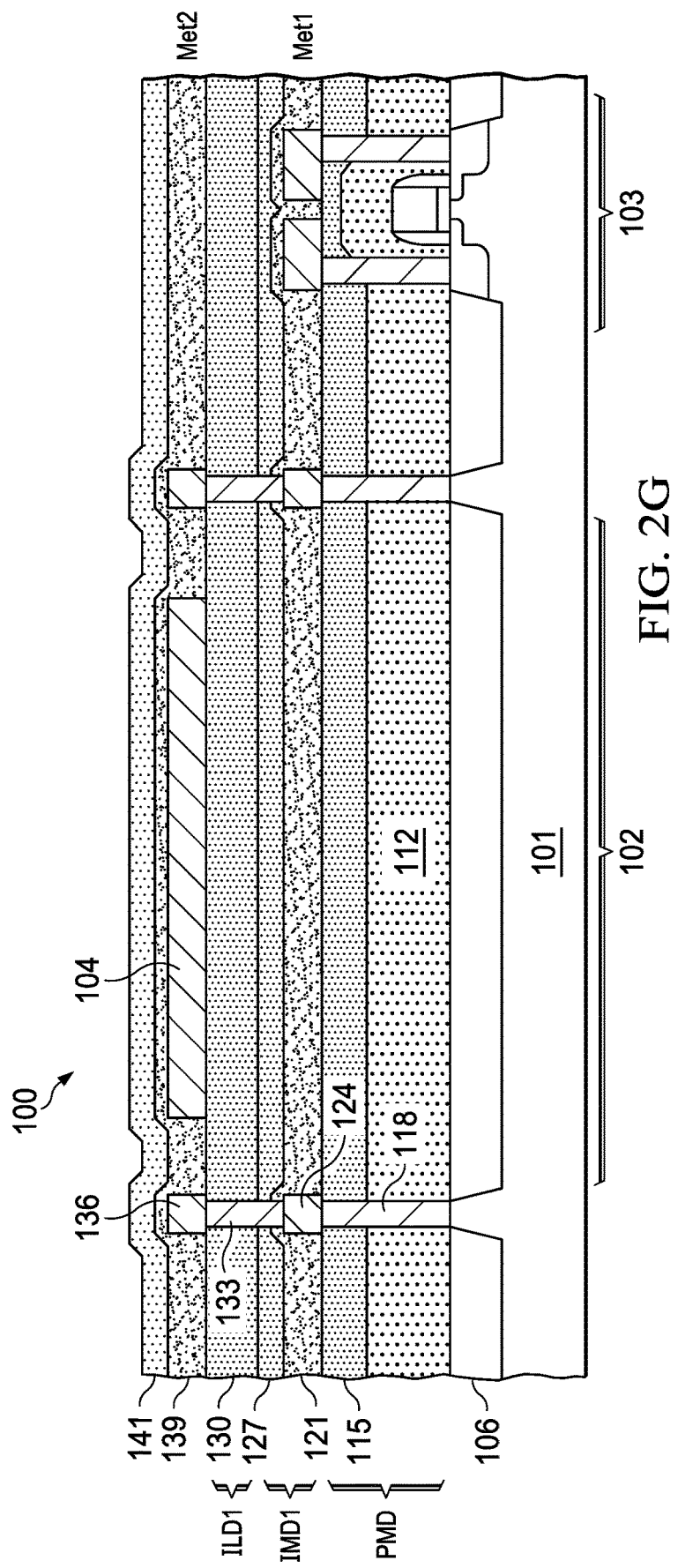
Figure 2H:
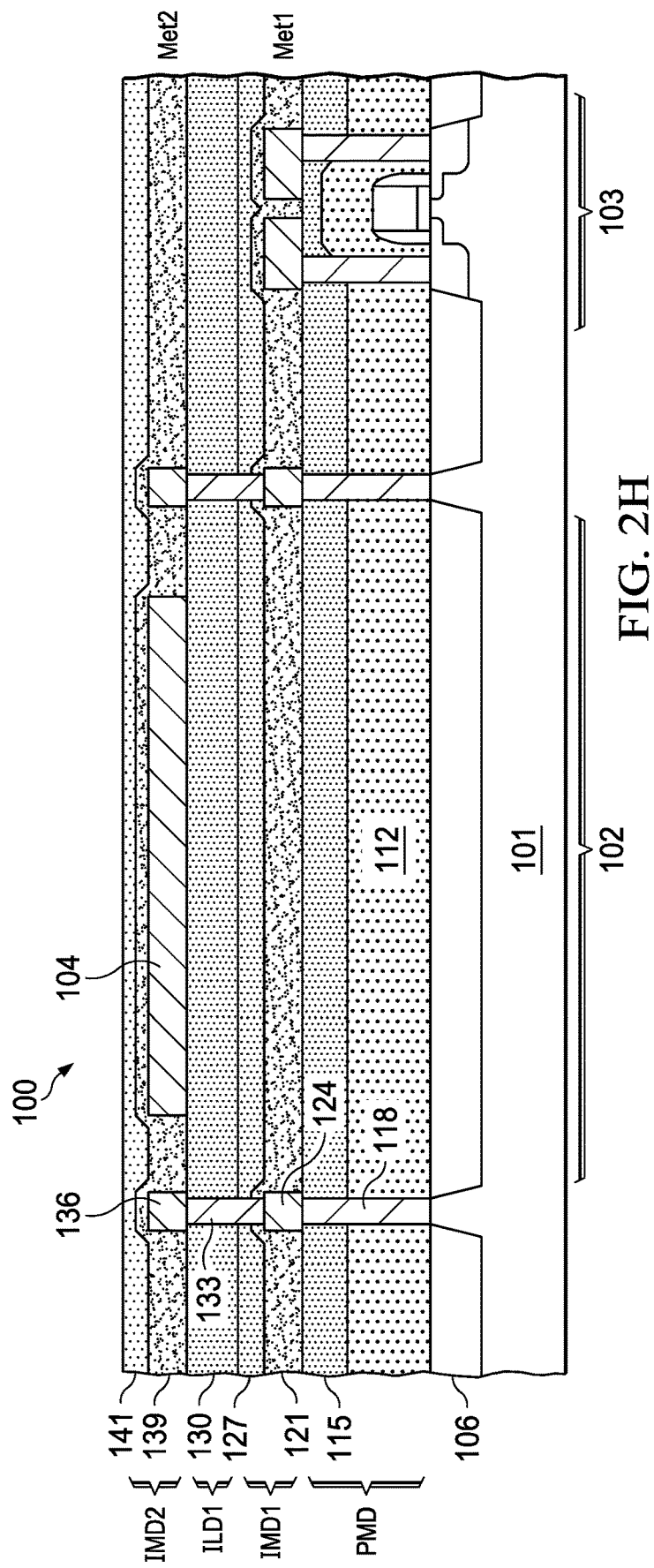

In FIG. 2G an HDP oxide layer 139 and a low-stress PE-TEOS layer 141 have been formed over the bottom plate 104. The use of the low-stress PE-TEOS at this level reduces the cumulative compressive stress of the dielectric stack relative to implementations that use the high-stress PE-TEOS. The topography of the PE-TEOS layer 141 surface mirrors the underlying MET2 structures 136 and bottom plate 104. Thus a CMP process may again be used to reduce the surface topography. FIG. 2H illustrates the device 100 after planarization of the low-stress PE-TEOS layer 141. The HDP oxide layer 139 and remaining low-stress PE-TEOS layer 141 are designated IMD2.

Figure 2I:
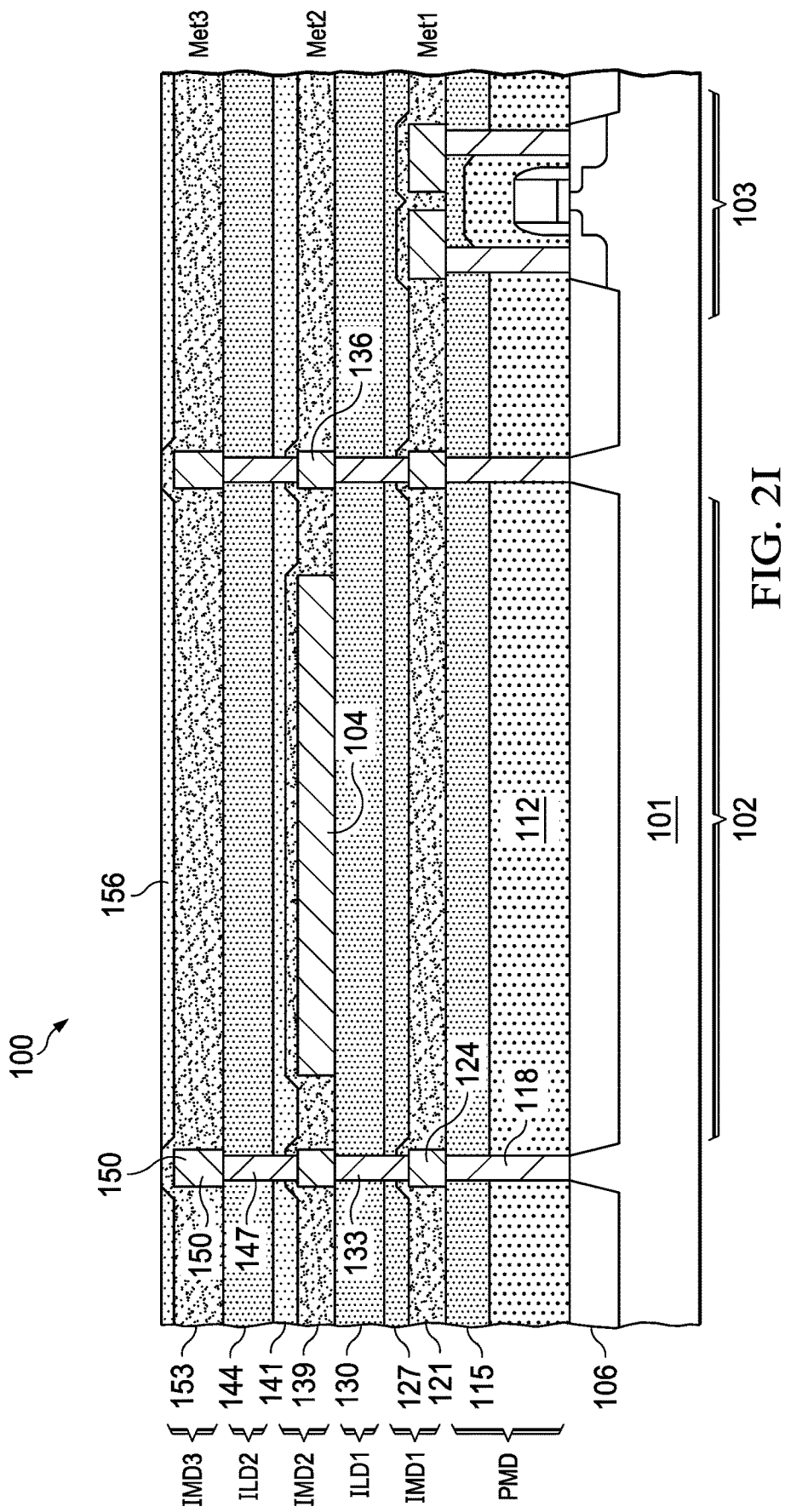

FIG. 2I illustrates the device 100 after forming the high-stress PE-TEOS layer 144, HDP oxide layer 153 and low-stress PE-TEOS layer 156 over the planarized surface. MET3 structures 150 have been formed, e.g. from aluminum, and vias 147 have been formed, e.g. from tungsten, connecting the MET3 structures 150 to the MET2 structures 136. The high-stress PE-TEOS layer 144 is designated ILD2, and the HDP oxide layer 153 and low-stress dielectric layer 156 are designated IMD3. Similar to the previous levels, the surface of the dielectric layer 156 has been planarized. The sequence of manufacturing steps used to produce the ILD2 and IMD3, the vias 147 and MET3 structures 150 may be repeated as needed to provide a desired distance between the bottom plate 104 and the top plate 105. Suitable adjustments may be made to accommodate metal spacing and thickness, and any requirements imposed by baseline and/or qualified processes in a particular manufacturing facility.

Figure 2J:
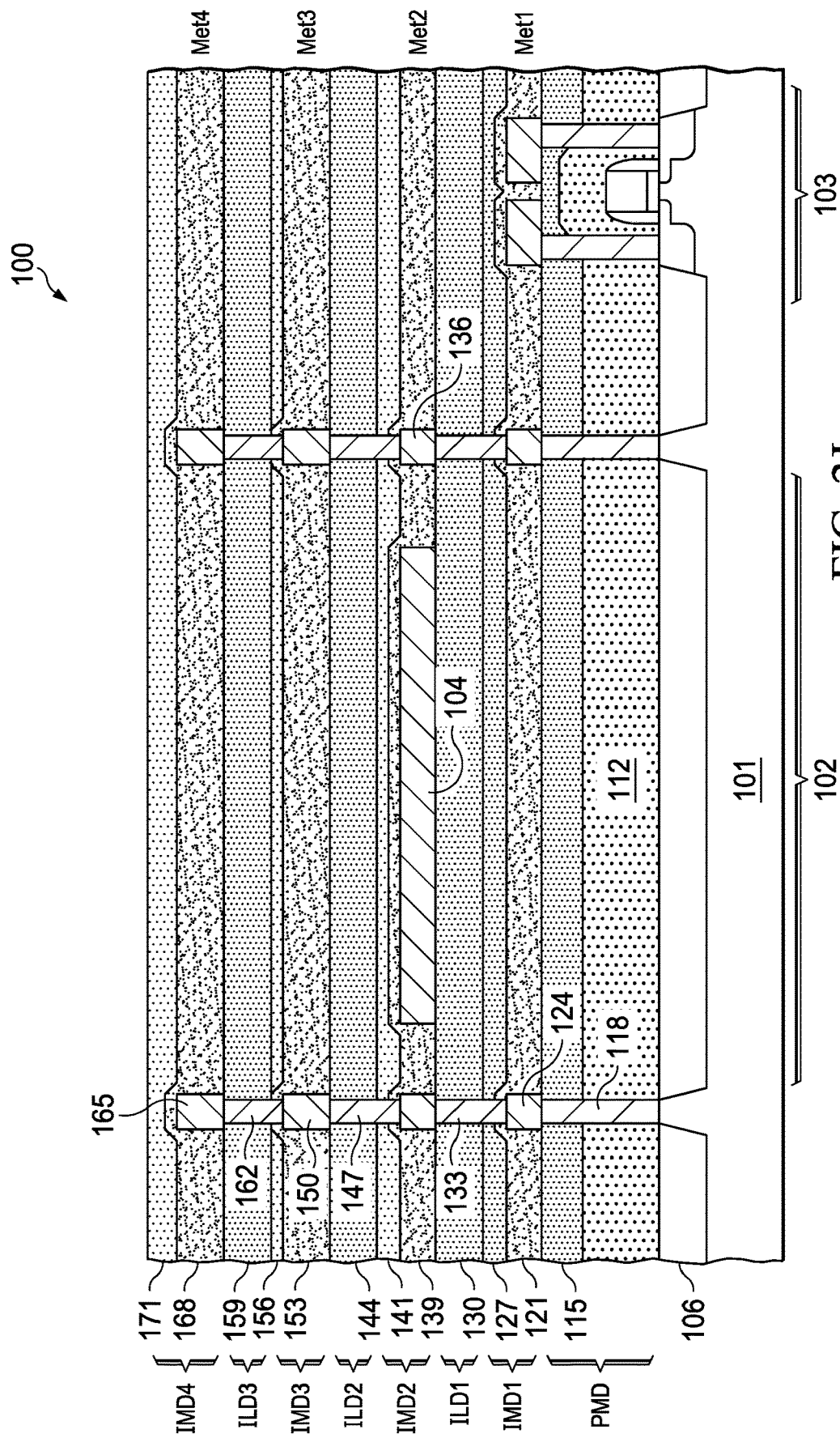

In the illustrated example, another via and metal level is formed, as shown in FIG. 2J. In this example, a high-stress PE-TEOS layer 159 is formed over the planar low-stress PE-TEOS layer 156, followed by an HDP oxide layer 168 and a low-stress PE-TEOS layer 171. MET4 structures 165 are located within the HDP oxide layer 168, and vias 162 connect the MET4 structures to the MET3 structures. The high-stress PE-TEOS layer 159 is designated ILD3, and the HDP oxide layer 168 and low-stress dielectric layer 171 are designated IMD4.

Figure 2K:
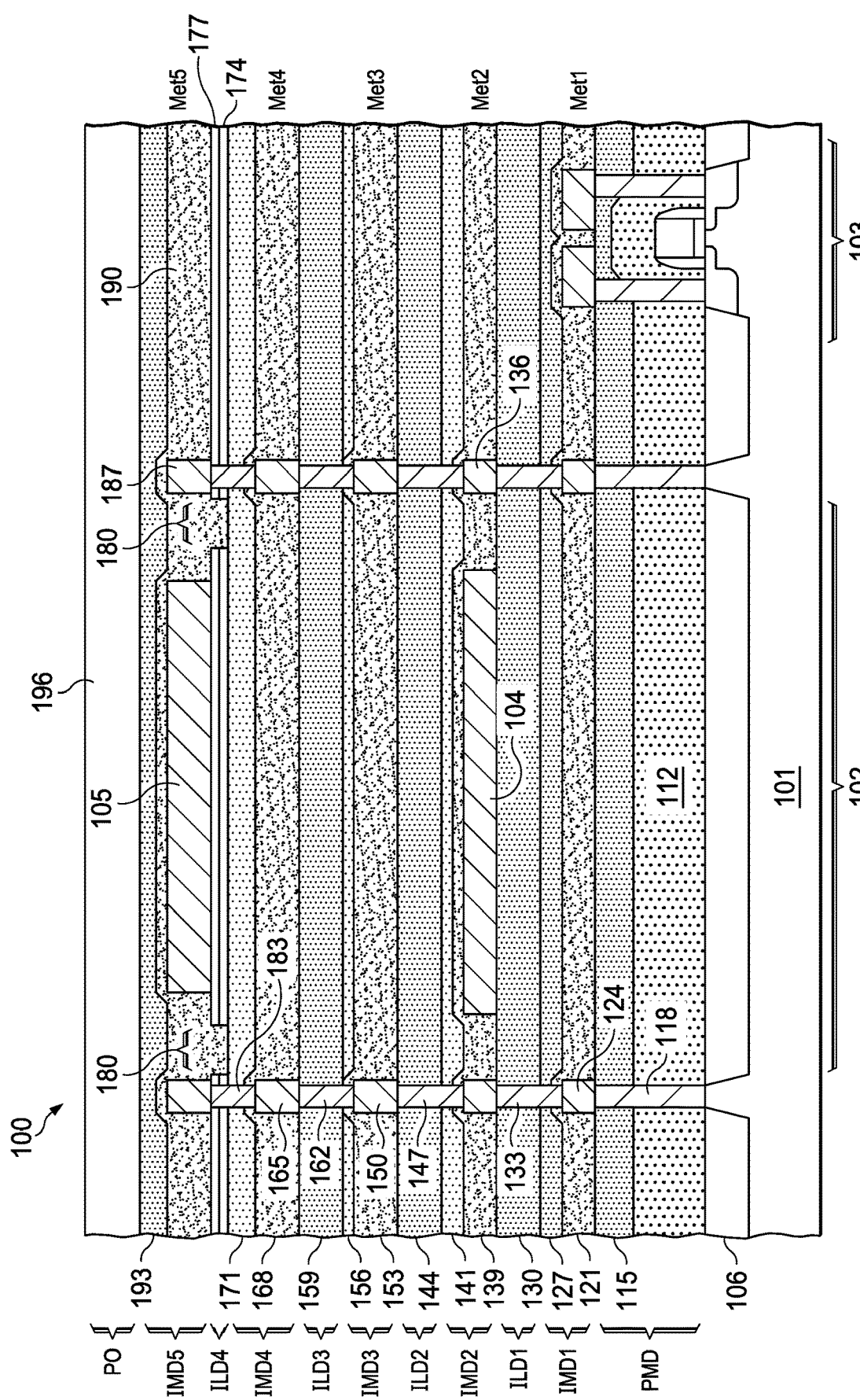

In FIG. 2K, a SiON layer 174 has been formed on the low-stress PE-TEOS layer 171, and a SiN layer 177 has been formed on the SiON layer 174. These layers may be formed conventionally, and may have a net compressive stress. For example, the SiON layer 174 may have a compressive stress of about nil, and the SiN layer 177 may have a compressive stress of about 100 MPa. A dielectric level designated ILD4 includes the SiN layer 177 and the SiON layer 174. MET5 structures 187 and the top plate 105 have been formed from, e.g. aluminum. Vias 183, e.g. tungsten, have been formed within the ILD4 and connect MET5 structures 187 to the MET4 structures 165. Optional cutouts 180 have been formed in the layers 174 and 177, exposing the underlying low-stress PE-TEOS layer 171. The cutouts 180 may be formed as described in U.S. Pat. No. 9,299,697. These openings are expected to increase the robustness of the device 100 against dielectric breakdown between the top plate 105 and the guard ring 109 through the SiN layer 177 or along an interface between layers 174 and 177.

After forming the top plate 105, and optionally the cutouts 180, an HDP oxide layer 190 has been formed over the top plate 105 and filling the cutouts 180. A high-stress PE-TEOS layer 193 has been formed over the HDP oxide layer 190 and planarized, and a SiON layer 196 has been formed over the PE-TEOS layer 193 as a PO layer. The SiON layer 196 may have a compressive stress of about 160 MPa to about 180 MPa in some examples, though stress is not limited to any particular value. The opening 199 may be formed over the top plate 105 by conventional patterning techniques, thereby producing the device 100 as illustrated in FIG. 1A.

The high-stress and low-stress PE-TEOS layers may be distinguished in a physical cross-section by appropriate treatment and microscopy. For example, a thin section may be treated with an RIE etch for 10-20 s, and then imaged with TEM. With such treatment, a detectable contrast is produced between the two types of dielectric. It is thought that the detectable contrast results from a different chemical potential in the two types of dielectric.

The preceding description of the example 5LM process sequence is not limited to any particular thicknesses of metal and dielectric layers. In one non-limiting example, the described benefit of compressive stress reduction may be achieved using 5LM metal layer thicknesses shown in Table II, and dielectric layer thicknesses shown in Table III. Two-hundred millimeter wafers processed consistent with these values may have a wafer bow of less than 200 μm as compared to a wafer bow greater than 200 μm for similar devices using high-stress PE-TEOS in place of the low-stress PE-TEOS layers of the illustrated example.

TABLE II

Metal Layer Thicknesses

| Level | 5LM | 7LM |
| --- | --- | --- |
| MET1 | 500 nm | 500 nm |
| MET2 | 600 nm | 500 nm |
| MET3 | 1.3 μm | 600 nm |
| MET4 | 1.3 μm | 1.3 μm |
| MET5 | 3.0 μm | 1.3 μm |
| MET6 | — | 1.3 μm |
| MET7 | — | 3.0 μm |

TABLE III

5LM Dielectric Layers

| Level | Layer Ref # | As-Deposited | Post-Planarization | Comp Stress |
| --- | --- | --- | --- | --- |
| IMD1 HDP Oxide | 121 | 600 nm | | 110 MPa |
| IMD1 HS PE-TEOS | 127 | 2.4 μm | 1 μm | 120 MPa |
| ILD1 HS PE-TEOS | 130 | 1.5 μm | | 120 MPa |
| IMD2 HDP Oxide | 139 | 600 nm | | 110 MPa |
| IMD2 LS PE-TEOS | 141 | 2.4 μm | 1 μm | 20 MPa |
| ILD2 HS PE-TEOS | 144 | 1.5 μm | | 120 MPa |
| IMD3 HDP Oxide | 153 | 1.3 μm | | 110 MPa |
| IMD3 LS PE-TEOS | 156 | 2.4 μm | 1 μm | 20 MPa |
| ILD3 HS PE-TEOS | 159 | 1.5 μm | | 120 MPa |
| IMD4 HDP Oxide | 168 | 1.3 μm | | 110 MPa |
| IMD4 LS PE-TEOS | 171 | 2.4 μm | 1.5 μm | 20 MPa |
| ILD4 SiON | 174 | 300 nm | | nil |
| ILD4 SiN | 177 | 650 nm | | 200 MPa |
| IMD5 HDP Oxide | 190 | 1.5 μm | | 110 MPa |
| IMD5 HS PE-TEOS | 193 | 3.6 μm | 1.4 μm | 120 MPa |
| PO SiON | 196 | 2.8 μm | | 170 MPa |

Figure 3:
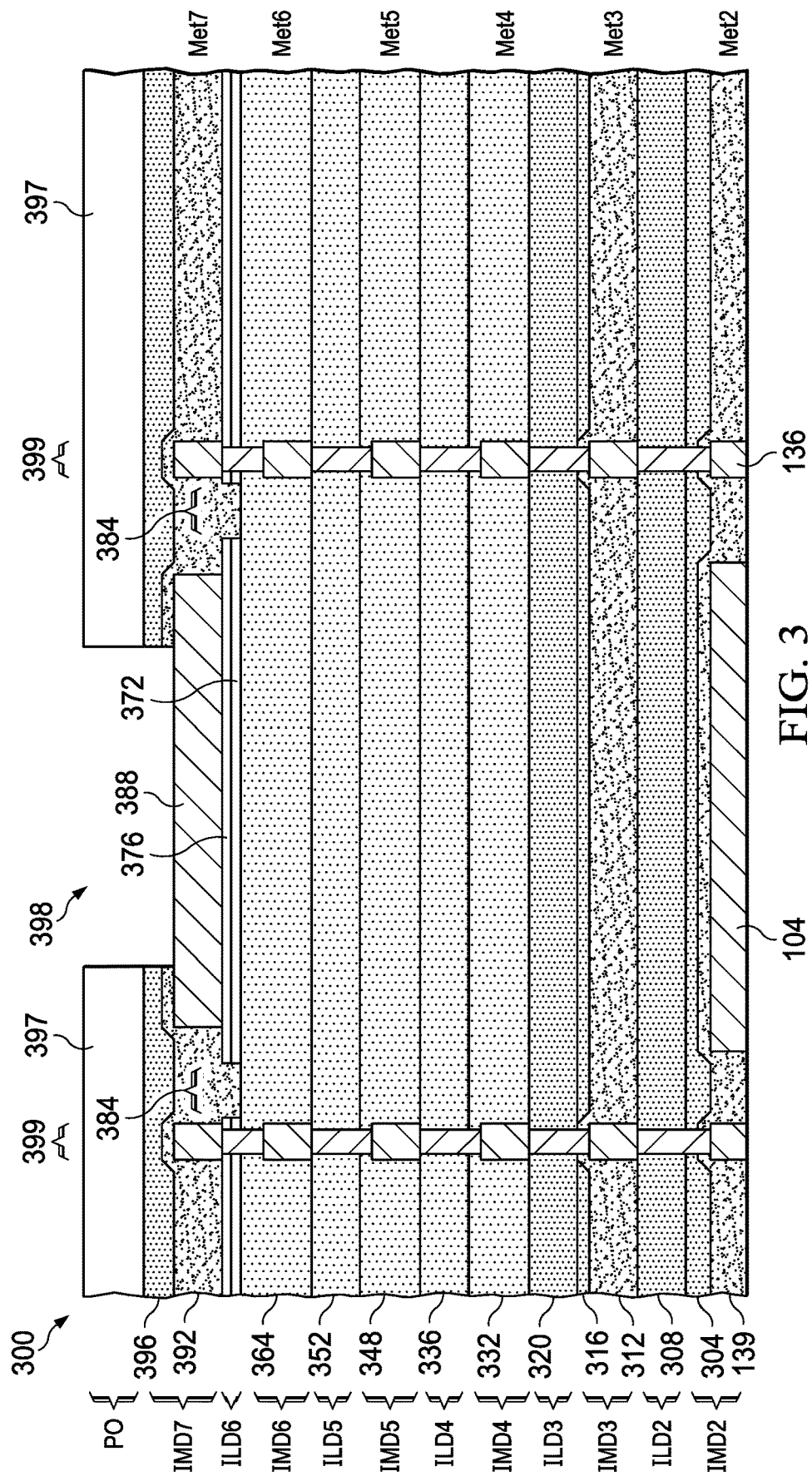
FIG. 3 illustrates a sectional view of an example capacitor implemented in a seven-level-metal (7LM) process.

Turning now to FIG. 3, an example of a 7LM device 300 is illustrated in section view. The device 300 is shown only for the MET2 layer and higher for brevity. Thus levels ILD2 . . . ILD6, IMD2 . . . IMD7 and MET2 . . . MET7 are shown. The features associated with the ILD2, IMD2 and MET2 levels are as described for the device 100, and therefore features therein retain their original reference number. Features below the IMD2 level may also be as described for the device 100. FIG. 3 reflects the option previously described in which a single high-stress PE-TEOS layer is used for both the ILD and a portion of the IMD over a thin metal layer.

The device 300 includes the lower plate 104 and an upper plate 388 at the MET7 level. An inner guard ring 399a and an outer guard ring 399b include unreferenced vias and metal structures that may be formed as described for the device 100. The device 300 also includes optional cutouts 384 and an opening 398 that exposes upper plate 388 for bonding.

Starting with the IMD2 level, the HDP oxide layer 139 is formed as previously described. A high-stress PE-TEOS layer 304 is formed over the HDP oxide layer 139 and planarized. In the illustrated example another high-stress PE-TEOS layer 308 is formed over and touches the high-stress PE-TEOS layer 304. In this example the HDP oxide layer 139 and the high-stress PE-TEOS layer 304 may be regarded as the IMD2 level, and the high-stress PE-TEOS layer 308 may be regarded as the ILD2 level. In other examples, a single high-stress PE-TEOS layer may be formed over the HDP-oxide layer 139 and planarized to a thickness similar to the combined thickness of the high-stress PE-TEOS layer 304 and the high-stress PE-TEOS layer 308. In such examples the single high-stress PE-TEOS layer serves as the ILD2 level and a portion of the IMD2 level, in that the single PE-TEOS layer fills topography associated with the MET2 level. Returning to the illustrated example, an HDP oxide layer 312 is formed over the high-stress PE-TEOS layer 308, followed by a high-stress PE-TEOS layer 316, which is then planarized. The layers 312 and 316 are designated IMD3. A high-stress PE-TEOS layer 320 is deposited over the planar surface of the high-stress PE-TEOS layer 316, and is designated ILD3. In some other examples, the high-stress PE-TEOS layer 316 and the high-stress PE-TEOS layer 320 may be replaced by a single layer of high-stress PE-TEOS and optionally planarized.

Five layers 332, 336, 348, 352 and 364 of low-stress PE-TEOS are then formed over the high-stress PE-TEOS layer 320, corresponding respectively to interconnect levels IMD4, ILD4, IMD5, ILD5 and IMD6. (JW: SiON immediately follows the planarization of the IMD6 LS TEOS layer.) This is followed by a SiON layer 372 and a SiN layer 376. Guard rings 399a and 399b are formed from metal structures and stacked vias at each IMD and ILD level, with topmost metal features and MET7. A MET7 top plate 388 may be formed simultaneously with the MET7 guard ring structures. Optional cutouts 384 may be formed as previously described.

An HDP oxide layer 392 may be formed over the SiN layer 376 and top plate 388, followed by a high-stress PE-TEOS layer 396, which may then be optionally planarized. A PO layer 397 may then be formed over the optionally planarized high-stress PE-TEOS layer 396, followed by patterning to form an opening 398 for wire bonding.

The described example 7LM process sequence is not limited to any particular thicknesses of metal and dielectric layers. In one non-limiting example, the described benefit of compressive stress reduction may be achieved using the 7LM metal layer thicknesses shown in Table II, and dielectric layer thicknesses shown in Table IV.

TABLE IV

7LM Dielectric Layers

| Level | Layer Ref # | As-Deposited | Post-Planarization | Comp Stress |
| --- | --- | --- | --- | --- |
| IMD1 HDP Oxide | 121 | 600 nm | | 110 MPa |
| IMD1/ILD1 HS PE-TEOS | 127 | 1.4 μm | 1.1 μm | 120 MPa |
| ILD1 HS PE-TEOS | 130 | 1.5 μm | | 120 MPa |
| IMD2 HDP Oxide | 139 | 600 nm | | 110 MPa |
| ILD2 HS PE-TEOS | 304 | 1.2 μm | 0.67 μm | 120 MPa |

TABLE IV-continued

7LM Dielectric Layers

| Level | Layer Ref # | As-Deposited | Post-Planarization | Comp Stress |
|---|---|---|---|---|
| IMD3 HDP Oxide | 312 | 600 nm | | 110 MPa |
| IMD3 HS PE-TEOS | 316 | 2 μm | 1 μm | 120 MPa |
| ILD3 HS PE-TEOS | 320 | 1 μm | | 120 MPa |
| IMD4 LS PE-TEOS | 332 | 3 μm | 1 μm | 20 MPa |
| ILD4 LS PE-TEOS | 336 | 1 μm | | 20 MPa |
| IMD5 LS PE-TEOS | 348 | 3 μm | 1 μm | 20 MPa |
| ILD5 LS PE-TEOS | 352 | 1 μm | | 20 MPa |
| IMD6 LS PE-TEOS | 364 | 3 μm | 1 μm | 20 MPa |
| ILD 6 SiON | 372 | 300 nm | | 0 |
| ILD6 SiN | 376 | 650 nm | | 200 MPa |
| IMD7 HDP Oxide | 392 | 1.5 μm | | 110 MPa |
| IMD7 HS PE-TEOS | 396 | 3.6 μm | 1.4 μm | 120 MPa |
| PO SiON | 397 | 2.8 μm | | 170 MPa |

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated circuit, comprising:
a metal top plate located over a substrate;
a metal bottom plate located between the top plate and the substrate;
a high-stress compressive silicon dioxide layer located between the bottom plate and the substrate; and
at least one low-stress compressive silicon dioxide layer located between the top plate and the bottom plate.

2. The integrated circuit of claim 1, wherein the high-stress silicon dioxide layer and the low-stress silicon dioxide layer are formed using a PE-TEOS process.

3. The integrated circuit of claim 1, further comprising a metal guard ring surrounding the top plate and the bottom plate.

4. The integrated circuit of claim 3, further comprising a transistor formed over the substrate, the guard ring located between the transistor and the bottom plate.

5. The integrated circuit of claim 1, wherein the at least one low-stress silicon dioxide layer includes a first PE-TEOS layer, and further comprising an HDP oxide layer between and touching the first PE-TEOS layer and a second PE-TEOS layer.

6. The integrated circuit of claim 5, wherein a first IMD level includes the first PE-TEOS layer and the HDP oxide layer, and the at least one low-stress silicon dioxide layer includes a third PE-TEOS layer, and further comprising a second IMD level including the third PE-TEOS layer and a second HDP oxide layer, the second IMD level located between the first IMD level and the top plate.

7. The integrated circuit of claim 1, wherein the at least one low-stress compressive silicon dioxide layer is one of a plurality of low-stress silicon dioxide layers located between the high-stress silicon dioxide layer and the top plate, each of the low-stress silicon dioxide layers touching a neighboring low-stress silicon dioxide layer.

8. The integrated circuit of claim 1, wherein the low-stress compressive silicon dioxide layer has a compressive stress in a range from about 15 MPa to about 40 MPa and the high-stress compressive dielectric layer has a compressive stress in a range from about 80 MPa to about 160 MPa.

9. The integrated circuit of claim 1, further comprising an HDP oxide layer touching sidewalls and a top surface of the top plate.

10. The integrated circuit of claim 1, wherein the top plate is located directly on a silicon nitride layer.

11. The integrated circuit of claim 1, wherein the top plate touches the high-stress compressive silicon oxide layer.

12. The integrated circuit of claim 1, wherein the top plate and the bottom plate are both circular with a diameter of about 100 μm.

13. The integrated circuit of claim 1, wherein the top plate and the bottom plate each have a long axis with a length of about 160 μm and a short axis with a length of about 120 μm.

14. A method of forming an integrated circuit, comprising:
forming a metal top plate over a substrate;
forming a metal bottom plate between the top plate and the substrate;
forming a high-stress compressive silicon dioxide layer between the bottom plate and the substrate; and
forming at least one low-stress compressive silicon dioxide layer between the top plate and the bottom plate.

15. The method of claim 14, wherein the high-stress silicon dioxide layer and the low-stress silicon dioxide layer are formed using a PE-TEOS process.

16. The method of claim 14, wherein forming the low-stress silicon dioxide layer includes forming a PE-TEOS layer in a capacitively coupled reactor using about 600 W power, about 667 Pa pressure, about 1700 mgm TEOS feed rate; and forming said high-stress silicon dioxide layer includes forming a PE-TEOS layer in a capacitively coupled reactor using about 850 W power, about 1093 Pa pressure, about 1900 mgm TEOS feed rate.

17. The method of claim 14, further comprising forming a guard ring surrounding the top plate and the bottom plate.

18. The method of claim 17, further comprising forming a transistor over the substrate, the guard ring located between the transistor and the bottom plate.

19. The method of claim 14, wherein the at least one low-stress silicon dioxide layer is a first PE-TEOS layer, and further comprising forming an HDP oxide layer between and touching the first PE-TEOS layer and a second PE-TEOS layer.

20. The method of claim 19, wherein a first IMD level includes the first PE-TEOS layer and the HDP oxide layer, and the at least one low-stress silicon dioxide layer includes a third PE-TEOS layer, and further comprising forming a second IMD level including the third PE-TEOS layer and a second HDP oxide layer, the second IMD level located between the first IMS level and the top plate.

21. The method of claim 14, wherein the at least one low-stress silicon dioxide layer is one of a plurality of low-stress silicon dioxide layers located between the high-stress silicon dioxide layer and the top plate, each of the low-stress silicon dioxide layers touching a neighboring low-stress silicon dioxide layer.

22. The method of claim 14, wherein the at least one low-stress compressive dielectric layer has a compressive stress in a range from about 15 MPa to about 40 MPa and the high-stress compressive dielectric layer has a compressive stress in a range from about 80 MPa to about 160 MPa.

23. The method of claim 14, further comprising forming an HDP oxide layer that touches sidewalls and a top surface of the top plate.

24. The method of claim 14, further comprising forming a silicon nitride layer between the top plate and the low-stress silicon dioxide layer, wherein the top plate touches the silicon nitride layer.

25. An integrated circuit, comprising:
- a semiconductor substrate having top and bottom metal plates formed thereover, the bottom plate located between the top plate and the substrate;
- a first compressive HDP oxide layer formed over and touching the bottom metal plate;
- a first compressive low-stress silicon dioxide layer located over and touching the first HDP oxide layer;
- a first compressive high-stress silicon dioxide layer located over and touching the first low-stress silicon dioxide layer;
- a second compressive HDP oxide layer formed over and touching the first high-stress silicon dioxide layer;
- a second compressive low-stress silicon dioxide layer located over and touching the second HDP oxide layer; and
- a second compressive high-stress silicon dioxide layer located over and touching the second low-stress silicon dioxide layer.

* * * * *